US008670963B2

(12) United States Patent  (10) Patent No.: US 8,670,963 B2
Huang  (45) Date of Patent: Mar. 11, 2014

(54) METHOD OF SELECTING DRILL BITS

(75) Inventor: Sujian J. Huang, Beijing (CN)

(73) Assignee: Smith International, Inc., Houston, TX (US)

( * ) Notice: Subject to any disclaimer, the term of this patent is extended or adjusted under 35 U.S.C. 154(b) by 1126 days.

(21) Appl. No.: 11/777,043

(22) Filed: Jul. 12, 2007

(65) Prior Publication Data

US 2008/0040084 A1   Feb. 14, 2008

Related U.S. Application Data

(60) Provisional application No. 60/832,043, filed on Jul. 20, 2006.

(51) Int. Cl.
    *G06G 7/48* (2006.01)
(52) U.S. Cl.
    USPC .................................. 703/7; 703/10
(58) Field of Classification Search
    USPC ...................... 703/2, 7, 10; 175/327
    See application file for complete search history.

(56) References Cited

U.S. PATENT DOCUMENTS

| | | | | |
|---|---|---|---|---|
| 5,313,829 A | * | 5/1994 | Paslay et al. | 73/152.58 |
| 5,704,436 A | * | 1/1998 | Smith et al. | 175/27 |
| 5,730,234 A | | 3/1998 | Putot | |
| 5,812,068 A | | 9/1998 | Wisler et al. | |
| 6,002,985 A | | 12/1999 | Stephenson | |
| 6,012,015 A | | 1/2000 | Tubel | |
| 6,021,377 A | | 2/2000 | Dubinsky et al. | |
| 6,044,325 A | | 3/2000 | Chakravarthy et al. | |
| 6,349,595 B1 | | 2/2002 | Civolani et al. | |
| 6,424,919 B1 | | 7/2002 | Moran et al. | |
| 6,516,293 B1 | | 2/2003 | Huang et al. | |
| 6,612,382 B2 | | 9/2003 | King | |
| 6,785,641 B1 | | 8/2004 | Huang | |
| 7,142,986 B2 | | 11/2006 | Moran | |
| 2001/0042642 A1 | * | 11/2001 | King | 175/40 |
| 2005/0015229 A1 | | 1/2005 | Huang | |
| 2005/0080595 A1 | | 4/2005 | Huang | |
| 2005/0096847 A1 | | 5/2005 | Huang | |
| 2005/0133272 A1 | | 6/2005 | Huang et al. | |
| 2005/0236184 A1 | | 10/2005 | Veeningen et al. | |

FOREIGN PATENT DOCUMENTS

GB        2367843 A      4/2002

OTHER PUBLICATIONS

Jim O'hare, Osarumwense OA Aigbekaen (JR), Design Index: Asystematic Method of PDC Drill-Bit Selection, Feb. 23, 2000, SPE, IADC/SPE Drilling Conference, pp. 1-15.*

(Continued)

*Primary Examiner* — Kamini S Shah
*Assistant Examiner* — Luke Osborne
(74) *Attorney, Agent, or Firm* — Osha Liang LLP

(57) ABSTRACT

A method for selecting at least one drill bit that includes characterizing an application; checking for at least one drill bit with an equivalent characterization in a data store; when the at least one drill bit with the equivalent characterization exists, selecting the at least one drill bit with the equivalent characterization; and when the at least one drill bit with the equivalent characterization does not exist, recommending at least one drill bit, making an analysis request, analyzing the at least one recommended drill bit based on the analysis request, generating analysis results, and selecting at least one drill bit based on the analysis results is disclosed.

13 Claims, 11 Drawing Sheets

(56) References Cited

OTHER PUBLICATIONS

Amit Poddar, "Add concurrent processing with message-driven beans Process a request concurrently in the J2EE framework", Java World published Jul. 18, 2003, retrieved on Feb. 1, 2012 from http://www.javaworld.com/javaworld/jw-07-2003/jw-0718-mdb.html, 5 pages.*

Canadian Office Action for corresponding Canadian Application No. 2,594,012 dated Dec. 10, 2009. (3 pages).

SPE No. 29922—The Computer Simulation of the Interaction Between Roller Bit and Rock. Dekun Ma; Desheng Zhou; Rong Deng. 9 pages, 1995.

Office Action issued in related United Kingdom Application No. GB0713987.6 dated Mar. 31, 2010 (3 pages).

Examination Report issued in corresponding British Application No. GB0713987.6; Dated Jan. 13, 2011 (7 pages).

Office Action issued in corresponding Canadian Patent Application No. 2,594,012; Dated Jan. 28, 2011 (4 pages).

Examination Report issued in corresponding British Application No. GB0713987.6; Dated Oct. 22, 2010 (5 pages).

Office Action issued in corresponding Canadian Application No. 2,594,012; Dated May 25, 2012 (3 pages).

Office Action issued in corresponding Canadian Application No. 2,776,346; Dated Aug. 23, 2013 (2 pages).

* cited by examiner

FIG. 7

|   | A | B | C | D | E | F | G | H | I |
|---|---|---|---|---|---|---|---|---|---|
| 1 | | | | Well Profile Directional Surveys | | | | | |
| 2 | MD (ft) | Inclination (deg) | Azimuth (deg) | | | | Comments | | |
| 3 | | | | | | | | | |
| 4 | | | | | | | | | |
| 5 | | | | | | | | | |
| 6 | | | | | | | | | |
| 7 | | | | | | | | | |
| 8 | | | | | | | | | |
| 9 | | | | | | | | | |
| 10 | | | | | | | | | |
| 11 | | | | | | | | | |
| 12 | | | | | | | | | |
| 13 | | | | | | | | | |
| 14 | | | | | | | | | |
| 15 | | | | | | | | | |
| 16 | | | | | | | | | |
| 17 | | | | | | | | | |
| 18 | Casing Program | #1 | #2 | #3 | #4 | #5 | Comments | | |
| 19 | Size (ins) | | | | | | | | |
| 20 | Weight (lbs/ft) | | | | | | | | |
| 21 | ID (ins) | | | | | | | | |
| 22 | Shoe MD (ft) | | | | | | | | |
| 23 | Linear Top MD (ft) | | | | | | | | |
| 24 | Linear Bottom MD (ft) | | | | | | | | |

| | A | B | C | D | E | F | G | H | I | J | K | L | M | N | O | P | Q | R | S | T |
|---|---|---|---|---|---|---|---|---|---|---|---|---|---|---|---|---|---|---|---|---|
| 1 | Component | Type | | | | | Drill String Information Information | | | | | Dimensions | | | | | | | | |
| 2 | | | A | B | C | D | E | F | G | H | I | J | K | L | M | N | O | P | Q | R |
| 3 | | Bit | | | | | | | | | | | | | | | | | | |
| 4 | 1 | | | | | | | | | | | | | | | | | | | |
| 5 | 2 | | | | | | | | | | | | | | | | | | | |
| 6 | 3 | | | | | | | | | | | | | | | | | | | |
| 7 | 4 | | | | | | | | | | | | | | | | | | | |
| 8 | 5 | | | | | | | | | | | | | | | | | | | |
| 9 | 6 | | | | | | | | | | | | | | | | | | | |
| 10 | 7 | | | | | | | | | | | | | | | | | | | |
| 11 | 8 | | | | | | | | | | | | | | | | | | | |
| 12 | 9 | | | | | | | | | | | | | | | | | | | |
| 13 | 10 | | | | | | | | | | | | | | | | | | | |
| 14 | 11 | | | | | | | | | | | | | | | | | | | |
| 15 | 12 | | | | | | | | | | | | | | | | | | | |
| 16 | 13 | | | | | | | | | | | | | | | | | | | |
| 17 | 14 | | | | | | | | | | | | | | | | | | | |
| 18 | 15 | | | | | | | | | | | | | | | | | | | |
| 19 | 16 | | | | | | | | | | | | | | | | | | | |
| 20 | 17 | | | | | | | | | | | | | | | | | | | |
| 21 | 18 | | | | | | | | | | | | | | | | | | | |
| 22 | 19 | | | | | | | | | | | | | | | | | | | |
| 23 | 20 | | | | | | | | | | | | | | | | | | | |
| 24 | 21 | | | | | | | | | | | | | | | | | | | |
| 25 | 22 | | | | | | | | | | | | | | | | | | | |
| 26 | 23 | | | | | | | | | | | | | | | | | | | |
| 27 | 24 | | | | | | | | | | | | | | | | | | | |
| 28 | 25 | | | | | | | | | | | | | | | | | | | |
| 29 | 26 | | | | | | | | | | | | | | | | | | | |
| 30 | 27 | | | | | | | | | | | | | | | | | | | |
| 31 | 28 | | | | | | | | | | | | | | | | | | | |
| 32 | 29 | | | | | | | | | | | | | | | | | | | |
| 33 | 30 | | | | | | | | | | | | | | | | | | | |
| 34 | 31 | | | | | | | | | | | | | | | | | | | |
| 35 | 32 | | | | | | | | | | | | | | | | | | | |
| 36 | 33 | | | | | | | | | | | | | | | | | | | |
| 37 | 34 | | | | | | | | | | | | | | | | | | | |
| 38 | 35 | | | | | | | | | | | | | | | | | | | |
| 39 | 36 | | | | | | | | | | | | | | | | | | | |
| 40 | 37 | | | | | | | | | | | | | | | | | | | |
| 41 | 38 | | | | | | | | | | | | | | | | | | | |
| 42 | 39 | | | | | | | | | | | | | | | | | | | |
| 43 | 40 | | | | | | | | | | | | | | | | | | | |

METHOD OF SELECTING DRILL BITS

The present application claims priority to U.S. Provisional Patent Application Ser. No. 60/832,043, filed on Jul. 20, 2006, and is hereby incorporated by reference in its entirety.

BACKGROUND OF INVENTION

1. Field of the Invention

The invention generally relates to methods of selecting drill bits.

2. Background Art

FIG. 1 shows one example of a conventional drilling system for drilling an earth formation. The drilling system includes a drilling rig 10 used to turn a drilling tool assembly 12 which extends downward into a wellbore 14. Drilling tool assembly 12 includes a drilling string 16, a bottom hole assembly ("BHA") 18, and a drill bit 20, attached to the distal end of drill string 16.

Drill string 16 comprises several joints of drill pipe 16a connected end to end through tool joints 16b. Drill string 16 transmits drilling fluid (through its central bore) and transmits rotational power from drill rig 10 to BHA 18. In some cases drill string 16 further includes additional components such as subs, pup joints, etc. Drill pipe 16a provides a hydraulic passage through which drilling fluid is pumped. The drilling fluid discharges through selected-size orifices in the bit ("jets") for the purposes of cooling the drill bit and lifting rock cuttings out of the wellbore as it is being drilled.

Bottom hole assembly 18 includes a drill bit 20. Typical BHAs may also include additional components attached between drill string 16 and drill bit 20. Examples of additional BHA components include drill collars, stabilizers, measurement-while-drilling ("MWD") tools, logging-while-drilling ("LWD") tools, and downhole motors.

In general, drilling tool assemblies 12 may include other drilling components and accessories, such as special valves, such as kelly cocks, blowout preventers, and safety valves. Additional components included in drilling tool assemblies 12 may be considered a part of drill string 16 or a part of BHA 18 depending on their locations in drilling tool assembly 12.

Drill bit 20 in BHA 18 may be any type of drill bit suitable for drilling earth formation. The most common types of earth boring bits used for drilling earth formations are fixed-cutter (or fixed-head) bits, roller cone bits, and percussion bits. FIG. 2 shows one example of a fixed-cutter bit. FIG. 3 shows one example of a roller cone bit.

Referring now to FIG. 2, fixed-cutter bits (also called drag bits) 21 typically comprise a bit body 22 having a threaded connection at one end 24 and a cutting head 26 formed at the other end. Cutting head 26 of fixed-cutter bit 21 typically comprises a plurality of ribs or blades 28 arranged about a rotational axis of the bit and extending radially outward from bit body 22. Cutting elements 29 are preferably embedded in the blades 28 to engage formation as bit 21 is rotated on a bottom surface of a wellbore. Cutting elements 29 of fixed-cutter bits may comprise polycrystalline diamond compacts ("PDC"), specially manufactured diamond cutters, or any other cutter elements known to those of ordinary skill in the art. These bits 21 are generally referred to as PDC bits.

Referring now to FIG. 3, a roller cone bit 30 typically comprises a bit body 32 having a threaded connection at one end 34 and one or more legs 31 extending from the other end. A roller cone 36 is mounted on a journal (not shown) on each leg 31 and is able to rotate with respect to bit body 32. On each cone 36, a plurality of cutting elements 38 are shown arranged in rows upon the surface of cone 36 to contact and cut a formation encountered by bit 30. Roller cone bit 30 is designed such that as it rotates, cones 36 of bit 30 roll on the bottom surface of the wellbore and cutting elements 38 engage the formation therebelow. In some cases, cutting elements 38 comprise milled steel teeth and in other cases, cutting elements 38 comprise hard metal inserts embedded in the cones. Typically, these inserts are tungsten carbide inserts or polycrystalline diamond compacts, but in some cases, hardfacing is applied to the surface of the cutting elements to improve wear resistance of the cutting structure.

Referring again to FIG. 1, for drill bit 20 to drill through formation, sufficient rotational moment and axial force must be applied to bit 20 to cause the cutting elements to cut into and/or crush formation as bit 20 is rotated. Axial force applied to bit 20 is typically referred to as the weight on bit ("WOB"). Additionally, the portion of the weight of drilling tool assembly 12 supported by a suspending mechanism of rig 10 is typically referred to as the hook load. Additionally, rotational moment can be provided by BHA components such as positive displacement motor or down hole turbines. Rotational moment applied to drilling tool assembly 12 by drill rig 10 (usually by a rotary table or a top drive) to turn drilling tool assembly 12 is referred to as the rotary torque. The speed at which drilling rig 10 rotates drilling tool assembly 12, typically measured in revolutions per minute ("RPM"), is referred to as the rotary speed.

The speed and economy with which a wellbore is drilled, as well as the quality of the hole drilled, depend on a number of factors. These factors include, among others, the mechanical properties of the rocks which are drilled, the diameter and type of the drill bit used, the flow rate of the drilling fluid, and the rotary speed and axial force applied to the drill bit. It is generally the case that for any particular mechanical property of a formation, a drill bit's rate of penetration ("ROP") corresponds to the amount of axial force on and the rotary speed of the drill bit. The rate at which the drill bit wears out is generally related to the ROP. Various methods have been developed to optimize various drilling parameters to achieve various desirable results.

Prior art methods for optimizing values for drilling parameters that primarily involve looking at the formation have focused on the compressive strength of the rock being drilled. For example, U.S. Pat. No. 6,349,595, issued to Civolani, et al. ("the '595 patent"), and assigned to the assignee of the present invention, discloses a method of selecting a drill bit design parameter based on the compressive strength of the formation. The compressive strength of the formation may be directly measured by an indentation test performed on drill cuttings in the drilling fluid returns. The method may also be applied to determine the likely optimum drilling parameters such as hydraulic requirements, gauge protection, WOB, and the bit rotation rate. The '595 patent is hereby incorporated by reference in its entirety.

U.S. Pat. No. 6,424,919, issued to Moran, et al. ("the '919 patent"), and assigned to the assignee of the present invention, discloses a method of selecting a drill bit design parameter by inputting at least one property of a formation to be drilled into a trained Artificial Neural Network ("ANN"). The '919 patent also discloses that a trained ANN may be used to determine optimum drilling operating parameters for a selected drill bit design in a formation having particular properties. The ANN may be trained using data obtained from laboratory experimentation or from existing wells that have been drilled near the present well, such as an offset well. The '919 patent is hereby incorporated by reference in its entirety.

ANNs are a relatively new data processing mechanism. ANNs emulate the neuron interconnection architecture of the human brain to mimic the process of human thought. By using empirical pattern recognition, ANNs have been applied in many areas to provide sophisticated data processing solutions to complex and dynamic problems (i.e., classification, diagnosis, decision making, prediction, voice recognition, military target identification, to name a few).

Similar to the human brain's problem solving process, ANNs use information gained from previous experience and apply that information to new problems and/or situations. The ANN uses a "training experience" (i.e., the data set) to build a system of neural interconnects and weighted links between an input layer (i.e., independent variable), a hidden layer of neural interconnects, and an output layer (i.e., the dependant variables or the results). No existing model or known algorithmic relationship between these variables is required, but such relationships may be used to train the ANN. An initial determination for the output variables in the training exercise is compared with the actual values in a training data set. Differences are back-propagated through the ANN to adjust the weighting of the various neural interconnects, until the differences are reduced to the user's error specification. Due largely to the flexibility of the learning algorithm, non-linear dependencies between the input and output layers, can be "learned" from experience.

Several references disclose various methods for using ANNs to solve various drilling, production, and formation evaluation problems. These references include U.S. Pat. No. 6,044,325 issued to Chakravarthy, et al., U.S. Pat. No. 6,002,985 issued to Stephenson, et al., U.S. Pat. No. 6,021,377 issued to Dubinsky, et al., U.S. Pat. No. 5,730,234 issued to Putot, U.S. Pat. No. 6,012,015 issued to Tubel, and U.S. Pat. No. 5,812,068 issued to Wisler, et al, which are hereby incorporated by reference in their entirety. Methods of determining a bit type may include the use of a drilling optimization service. The drilling optimization service may identify rock type, strength, and porosity, as well as formation abrasion and potential impact from formation. The appropriate cutting structure may thereby be determined. One such service, called DBOS™, is offered by Smith International, Inc., the assignee of the entire right in the present application. The use of the drilling optimization service is disclosed in U.S. patent application Ser. No. 11/048,516, assigned to the assignee of the present invention, and hereby incorporated by reference in its entirety.

However, optimization predictions from these methods may not be as accurate as simulations of drilling, which may be better equipped to make predictions for each unique situation.

Simulation methods have been previously introduced which characterize either the interaction of a bit with the bottom hole surface of a wellbore or the dynamics of the BHA 18.

One simulation method for characterizing interaction between a roller cone bit and an earth formation is described in U.S. Pat. No. 6,516,293 ("the '293 patent"), entitled "Method for Simulating Drilling of Roller Cone Bits and its Application to Roller Cone Bit Design and Performance," and assigned to the assignee of the present invention. The '293 patent discloses methods for predicting cutting element interaction with earth formations. Furthermore, the '293 patent discloses types of experimental tests that can be performed to obtain cutting element/formation interaction data. The '293 patent is hereby incorporated by reference in its entirety. Another simulation method for characterizing cutting element/formation interaction for a roller cone bit is described in Society of Petroleum Engineers (SPE) Paper No. 29922 by D. Ma et al., entitled, "The Computer Simulation of the Interaction Between Roller Bit and Rock". A simulation method for simulating the dynamic response of a drilling tool assembly is disclosed in U.S. Pat. No. 6,785,641 ("the '641 patent"), entitled "Simulating the Dynamic Response of a Drilling Tool Assembly and its Application to Drilling Tool Assembly Design Optimization and Drilling Performance Optimization." The '641 patent is hereby incorporated by reference in its entirety.

Similarly, U.S. patent application Ser. No. 10/888,523 ("the '523 application") entitled "Methods for Designing Fixed Cutter Bits and Bits Made Using Such Methods," and U.S. patent application Ser. No. 10/888,358 ("the '358 application") entitled "Methods for Modeling, Displaying, Designing, and Optimizing Fixed Cutter Bits," both assigned to the assignee of the present invention, disclose methods for modeling and simulating the performance of PDC bits. The '523 application and the '358 application disclose modeling and simulating by taking into account actual interactions between cutters and earth formations during drilling. U.S. patent application Ser. No. 10/888,354 ("the '354 application") entitled "Methods for Modeling Wear of Fixed Cutter Bits and for Designing and Optimizing Fixed Cutter Bits," and assigned to the assignee of the present invention, discloses a method for modeling and simulating the wear of PDC bits. The '354 application also takes into account actual interactions between cutters and earth formations during drilling. U.S. patent application Ser. No. 10/888,446 ("the '466 application") entitled "Methods for Modeling, Designing, and Optimizing Drilling Tool Assemblies," and assigned to the assignee of the present invention, discloses methods for modeling and simulating the dynamic response of a drilling tool assembly. The '523 application, the '358 application, the '354 application, and the '446 application are hereby incorporated by reference in their entirety.

In drilling a certain formation, one of the most important factors is the type of drill bit used. Thus, selecting the best drill bit is crucial. Even before drilling begins, a myriad of information may be available, including drilling parameters, well profile, and information on the drill string. What is needed is a streamlined method of selecting the best drill bit or bits based on the available information.

SUMMARY OF INVENTION

In one aspect, embodiments disclosed herein relate to a method for selecting at least one drill bit that includes characterizing an application; checking for at least one drill bit with an equivalent characterization in a data store; when the at least one drill bit with the equivalent characterization exists, selecting the at least one drill bit with the equivalent characterization; and when the at least one drill bit with the equivalent characterization does not exist, recommending at least one drill bit, making an analysis request, analyzing the at least one recommended drill bit based on the analysis request, generating analysis results, and selecting at least one drill bit based on the analysis results.

In another aspect, embodiments disclosed herein relate to a method for selecting at least one drill bit for an application that includes characterizing the application; simulating a first drill bit under the characterized application; generating simulation results for the first drill bit; simulating a second drill bit under the characterized application; generating simulation results for the second drill bit; and selecting at least one drill bit based on the simulation results for the first drill bit and the second drill bit, wherein the characterizing the application includes selecting earth formation and drilling operation parameters and conditions, and the simulation results comprise performance values for at least one of rate of penetration, wear rate, and axial or lateral vibrations.

In yet another aspect, embodiments disclosed herein relate to a method for selecting at least one drill bit that includes characterizing two applications; simulating a first drill bit under the first characterized application; generating simulation results for the first drill bit; simulating a second drill bit under the first characterized application; generating simulation results for the second drill bit; simulating a third drill bit under the second characterized application; generating simulation results for the third drill bit; and selecting at least one drill bit based on the simulation results for the first drill bit, the second drill bit, and the third drill bit, wherein the characterizing the first application and characterizing the second application includes selecting earth formation and drilling operation parameters and conditions, and each of the simulation results comprise performance values for at least one of rate of penetration, wear rate, and axial or lateral vibrations.

Other aspects and advantages of the invention will be apparent from the following description and the appended claims.

BRIEF DESCRIPTION OF DRAWINGS

FIG. 7 shows an example sheet of an analysis request ST200 in accordance with an embodiment of the invention.

FIG. 8 shows an example sheet of an analysis request ST200 in accordance with an embodiment of the invention.

FIG. 9 shows an example sheet of an analysis request ST200 in accordance with an embodiment of the invention.

FIG. 10 shows an example sheet of an analysis request ST200 in accordance with an embodiment of the invention.

DETAILED DESCRIPTION

Exemplary embodiments of the invention will be described with reference to the accompanying figures. Like items in the figures are shown with the same reference numbers. Further, the use of "ST" in the figures is equivalent to the use of "Step" in the detailed description below.

In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiments of the invention relate to methods and apparatus for selecting one or more drill bits. More specifically, one or more embodiments of the invention relate to methods for selecting drill bits based on equivalent characterizations in the data store or on analysis conducted based on an analysis request.

Figure 1:
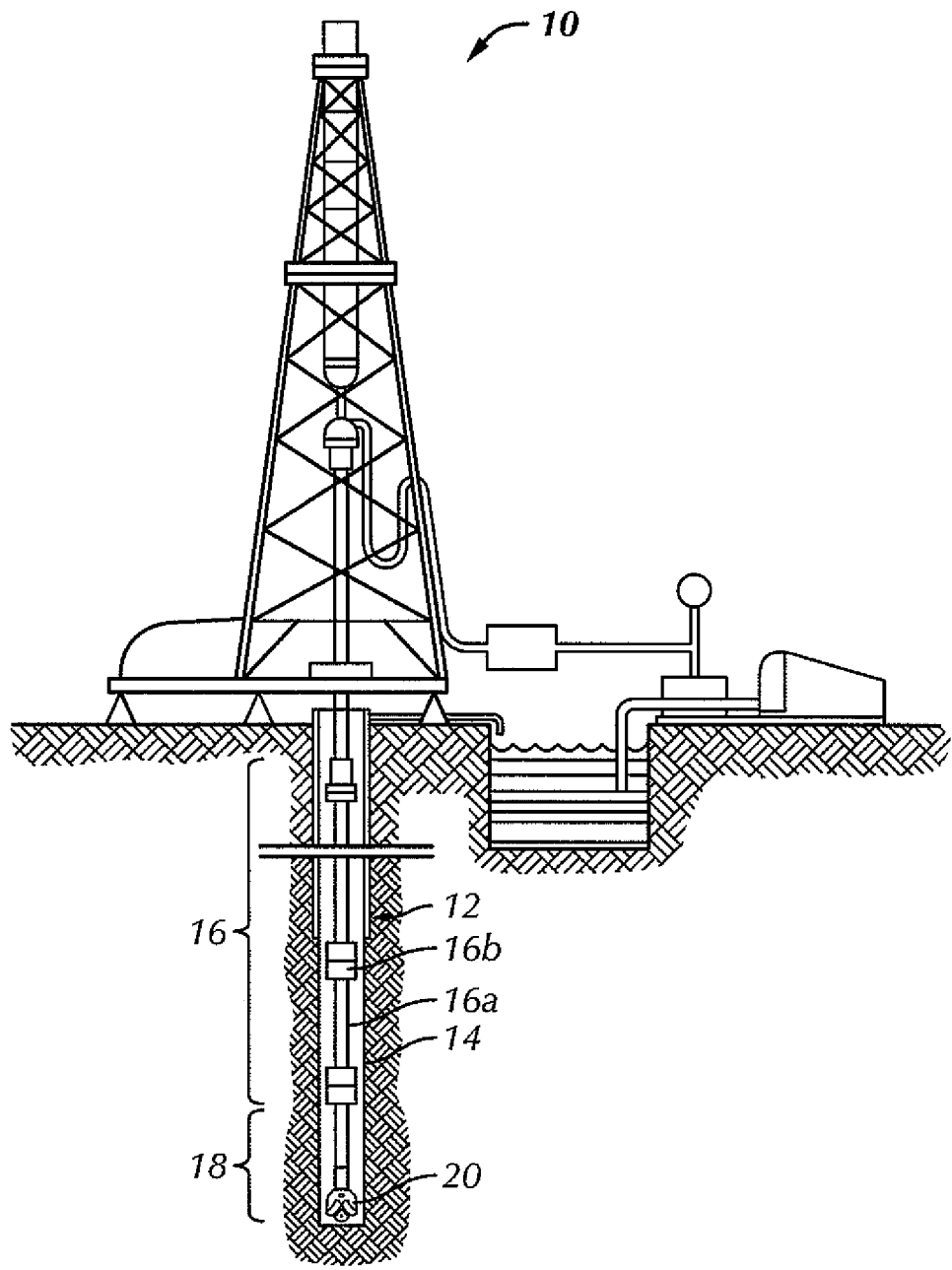
FIG. 1 is a schematic diagram of a drilling system to drill earth formations in accordance with the prior art.
Figure 2:
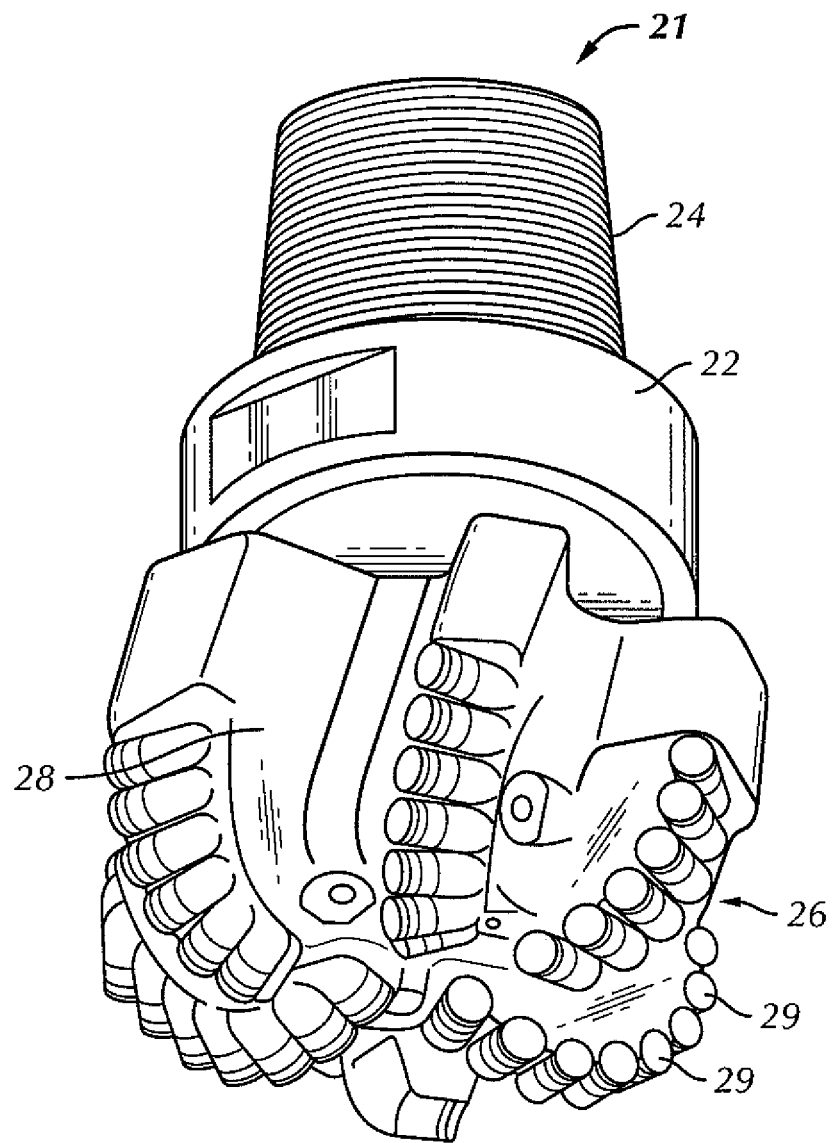
FIG. 2 is a perspective-view drawing of a prior art fixed-cutter bit.
Figure 3:
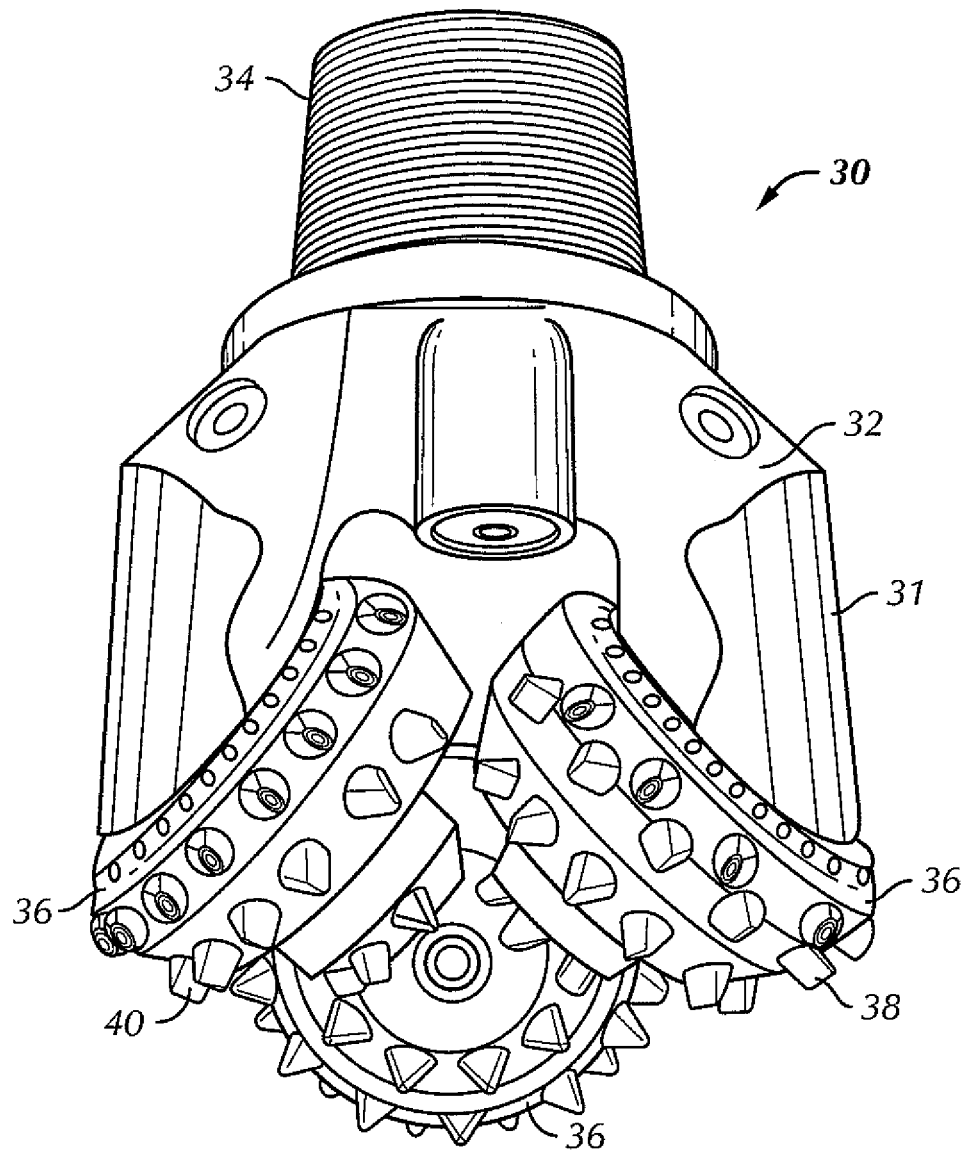
FIG. 3 is a perspective-view drawing of a prior art roller cone bit.
Figure 4:
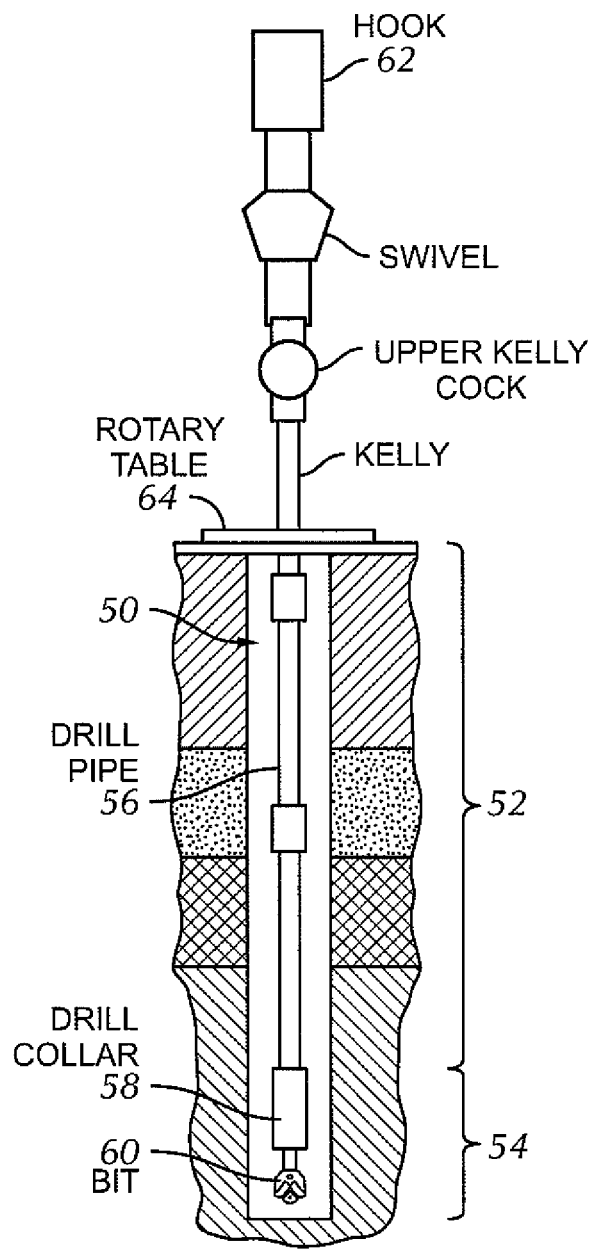
FIG. 4 is a drilling tool assembly in accordance with embodiments of the present invention.
Figure 5:
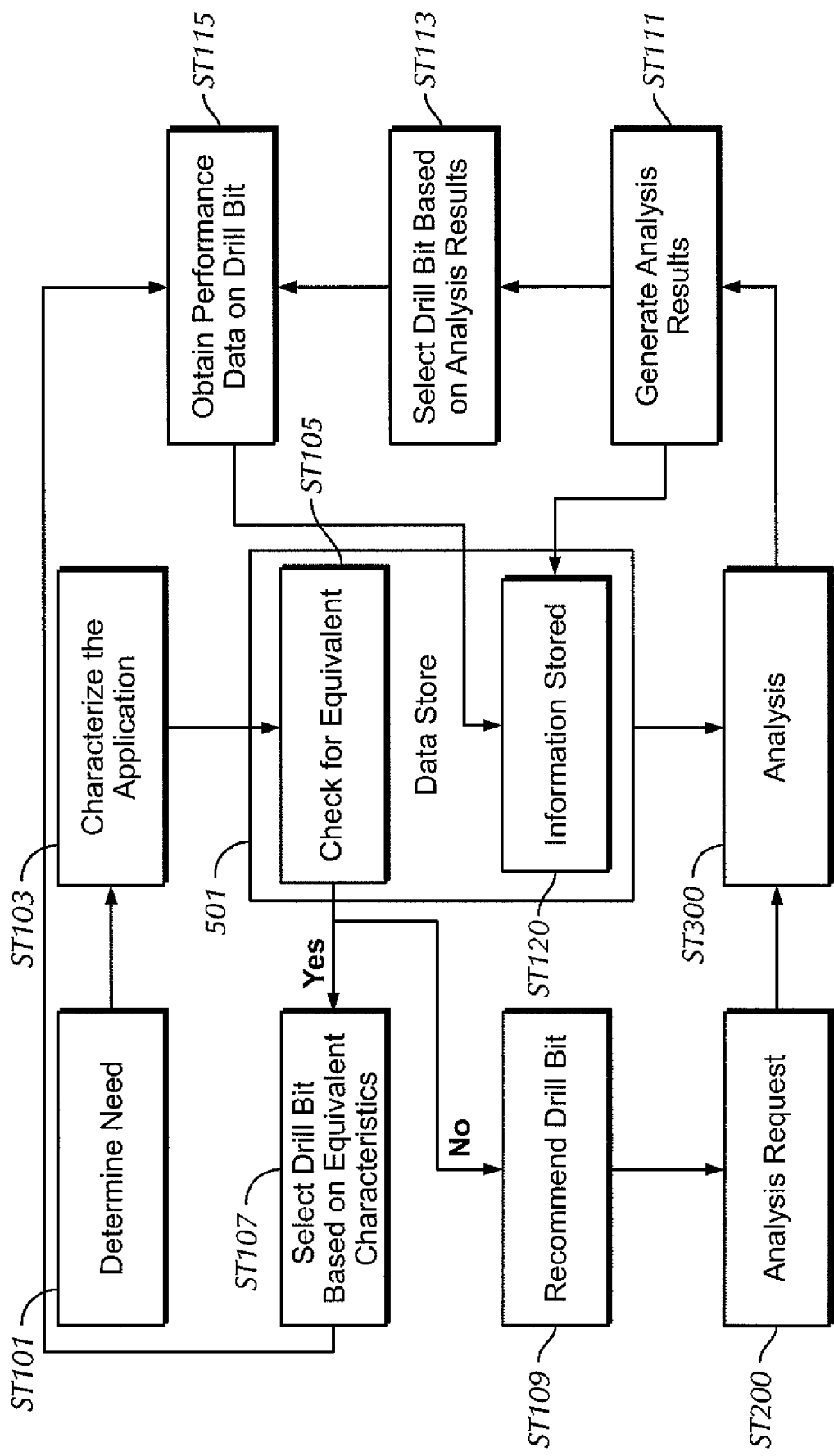
FIG. 5 shows a flow diagram of a method for selecting one or more drill bits in accordance with an embodiment of the invention.

Referring now to FIG. 5, a flow diagram of a method for selecting one or more drill bits in accordance with an embodiment of the invention is shown. Drilling need information is determined ST101 by, for example, a customer call, a proposal, or other forms of communication. The application based on the need determined at ST101 is then characterized ST103. The characterization may include, for example, BHA information, formation information, drilling parameters, and well profile information. The characterized application is then compared to application characterizations stored in a data store 501 to check whether there are any drill bits associated with equivalent characterizations ST105. This information may come, for example, from past simulations and analyses, as well as gathered field data. If there is an equivalent characterization (Yes at ST105), then at least one drill bit associated with the equivalent characterization is selected ST107. If there is no equivalent characterization in the database (No at ST105), then one or more drill bits are recommended ST109. The drill bit may be recommended ST109, for example, based on similar characterization determined when checking for equivalent characterization ST105. The drill bit recommendation ST109 may also be made, for example, by a field engineer who has knowledge on the types of drill bits used in similar applications, or by using a drilling optimization service, such as DBOS™, as explained in the background section. For example, the drilling optimization service could be used to identify the best bits used under similar conditions. In such a case, information from drill bits used in offset wells or similar applications and information from the applications to be analyzed may be used to identify a selection of recommended drill bits for the particular application. An analysis request ST200 is then made, based on the recommended drill bits. An example analysis request ST200 will be explained later in detail with reference to FIGS. 7-10. Once the analysis request ST200 is processed, drill bit analysis ST300 is carried out based on the analysis request ST200. The drill bit analysis ST300 will be explained in detail with reference to FIGS. 11(*a*), 11(*b*), and 11(*c*). Once the drill bit analysis ST300 is completed, analysis results are generated ST111. The analysis results may include rate of penetration, wear rate, torque response, axial or lateral vibrations, and trajectory of path drilled. The analysis results may be stored ST120 in the data store 501 for future applications. At least one drill bit is then selected ST113 based on the generated analysis results from ST111. After the selected drill bit is used in the field for the particular application, performance data from the selected drill bit may be collected ST115, and stored in the data store ST120.

Figure 6:
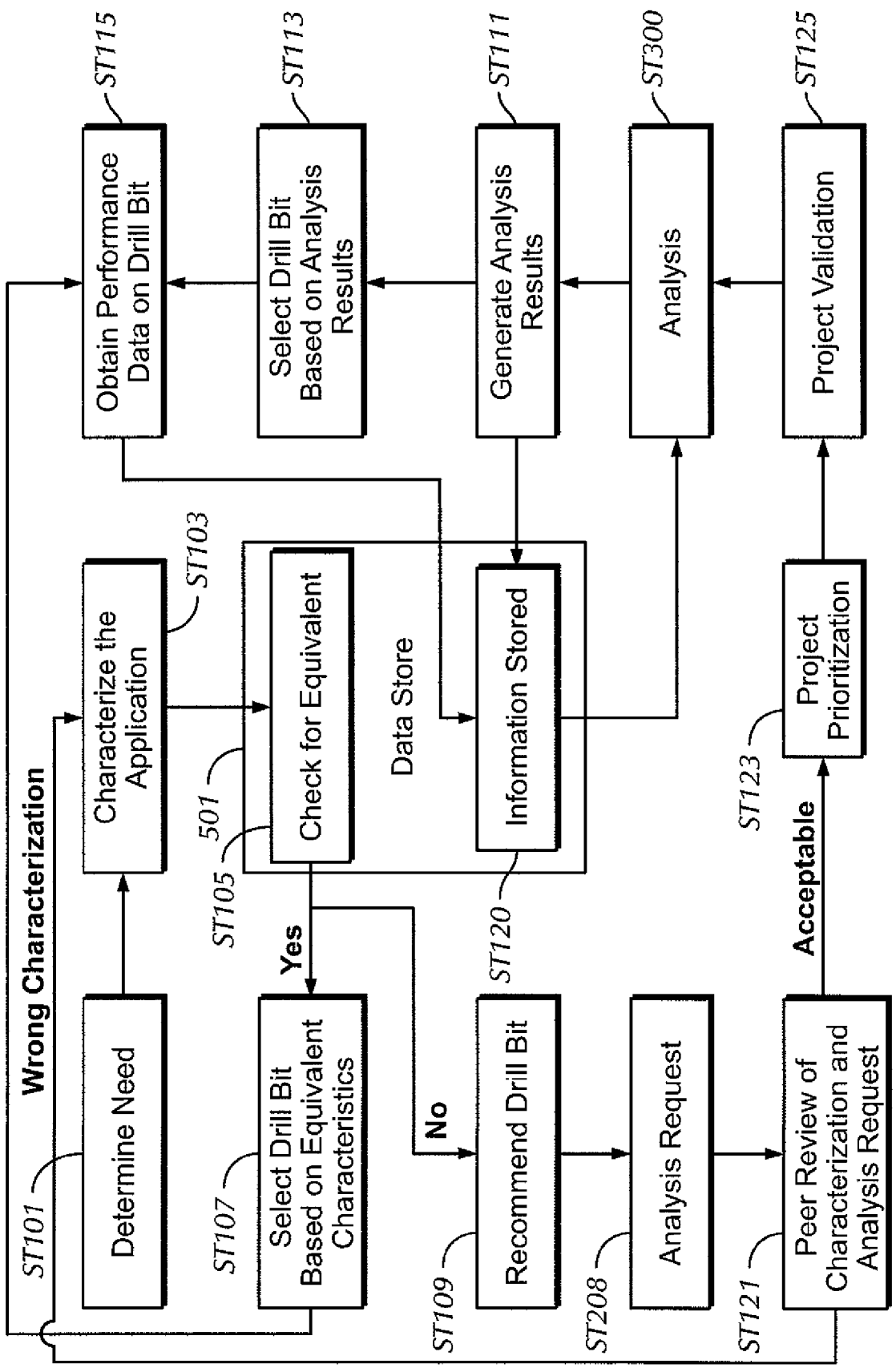
FIG. 6 shows a flow diagram of a method for selecting one or more drill bits in accordance with another embodiment of the invention.

Referring now to FIG. 6, a flow diagram of a method for selecting one or more drill bits in accordance with another embodiment of the invention is shown. Drilling need information is determined ST101 by, for example, a customer call, a proposal, or other forms of communication. The application based on the need determined at ST101 is then characterized ST103. The characterization may include, for example, BHA information, formation information, drilling parameters, and well profile information. The characterized application is then compared to application characterizations stored in a data store 501 to check whether there are any drill bits associated with equivalent characterizations ST105. This information may come, for example, from past simulations and analyses, as well as gathered field data. If there is an equivalent characterization (Yes at ST105), then at least one drill bit associated with the equivalent characterization is selected ST107. If there is no equivalent characterization in the database (No at ST105), then one or more drill bits are recommended ST109. The drill bit may be recommended ST109, for example, based on similar characterization determined when checking for equivalent characterization ST105. The drill bit recommendation ST109 may also be made, for example, by a field engineer who has knowledge on the types of drill bits used in similar applications, or by using a drilling optimization service, such as DBOS™, as explained in the background section. For example, the drilling optimization service could be used to identify the best bits used under similar conditions. In such a case, information from drill bits used in offset wells or similar applications and information from the applications to be analyzed may be used to identify a selection of recommended drill bits for the particular application. An analysis request ST200 is then made, based on the recommended drill bits. An example analysis request ST200 will be explained later in detail with reference to FIGS. 7-10. A peer review ST121 of both the application characterization from ST103 and the analysis request from ST200 is then carried out to make sure there has been no mistake in the characterizing the application ST103, and that the analysis request ST200 has been filled out correctly. Preferably, this peer review would be performed by field engineers with experience and training in spotting bad analysis requests and incorrect characterizations. Alternatively, the peer review ST121 could also be carried out by a trained administrator. If the application characterization is found to be wrong, then it is sent back to be recharacterized. If, on the other hand, the analysis request is found not to have been filled out correctly or is incomplete, then it will be sent back to be filled out again. Because the analysis request ST200 is dependent on a correct application characterization from ST103, if both the application characterization and the analysis request is found to be unacceptable, it will be sent back to the application characterization step ST103. Once the application characterization and analysis request ST200 is found to be acceptable, the project is prioritized ST123 in relation to other analysis requests. Considerations for the prioritization ST123 may include urgency of selecting the drill bit, the volume of drilling that would be done in the application, and other considerations. Once the higher priority analysis requests are completed, a project engineer then validates ST125 the analysis request. Once the analysis request is validated ST125, drill bit analysis ST300 is carried out based on the analysis request ST200. The drill bit analysis ST300 will be explained in detail with reference to FIGS. 11(a), 11(b), and 11(c). Once the drill bit analysis ST300 is completed, analysis results are generated ST111. The analysis results may include rate of penetration, wear rate, torque response, axial or lateral vibrations, and trajectory of path drilled. The analysis results may be stored ST120 in the data store 501 for future applications. At least one drill bit is then selected ST113 based on the generated analysis results from ST111. After the selected drill bit is used in the field for the particular application, performance data from the selected drill bit may be collected ST115, and stored in the data store ST120.

Referring now to FIGS. 7-10, an example of an analysis request ST200 in accordance with an embodiment of the invention is shown. The analysis request ST200 may be in the form of localized spreadsheets, but could also be in the form of intranet or web based application. In this embodiment, the analysis request ST200 has four spreadsheets. The first three spreadsheets require data entry, while the last spreadsheet is for reference.

Figure 7:
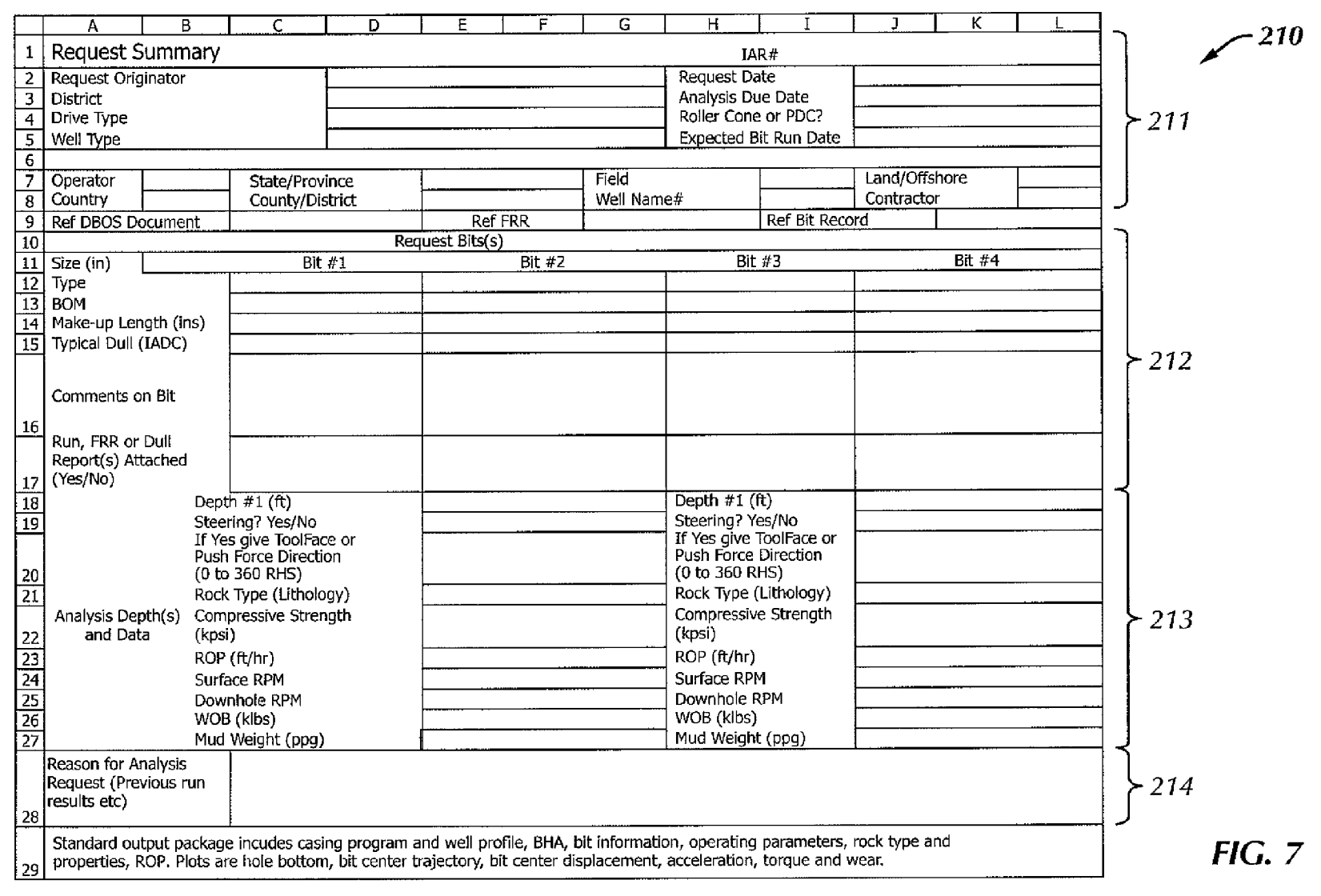

The first spreadsheet, as shown in FIG. 7, is the request summary sheet 210. The request summary sheet 210 includes information on the originator of the request and location, as well as the bit types and parameters to be used in the analysis. The header 211 of the request summary sheet 210 contains basic information about who originated the request, dates, and location. The request bit field 212 is where the recommended drill bits from ST109 is entered. The drilling parameters field 213 is where the drilling parameters and run information is entered. Because there are a number of different available outputs from the analysis ST300, a reasons for analysis request field 214 is available. The reasons for analysis request could in part drive the output configuration of the analysis ST300. Specifically requested may also be entered in the reasons for analysis request field 214.

The second spreadsheet, as shown in FIG. 8, is well profile information sheet 220. The well profile information sheet 220 includes the well path geometry and the casing program. Measured depth, inclination, and azimuth for the different trajectory changes are entered in the well profile directional surveys field 221, and fully define the well path. Casing program information is entered into the casing program field 222.

The third spreadsheet, as shown in FIG. 9, is the drill string information sheet 230. Because the drill bit has already been defined earlier, no data for the drill bit needs to be entered in the drill string information sheet 230.

Figure 10:
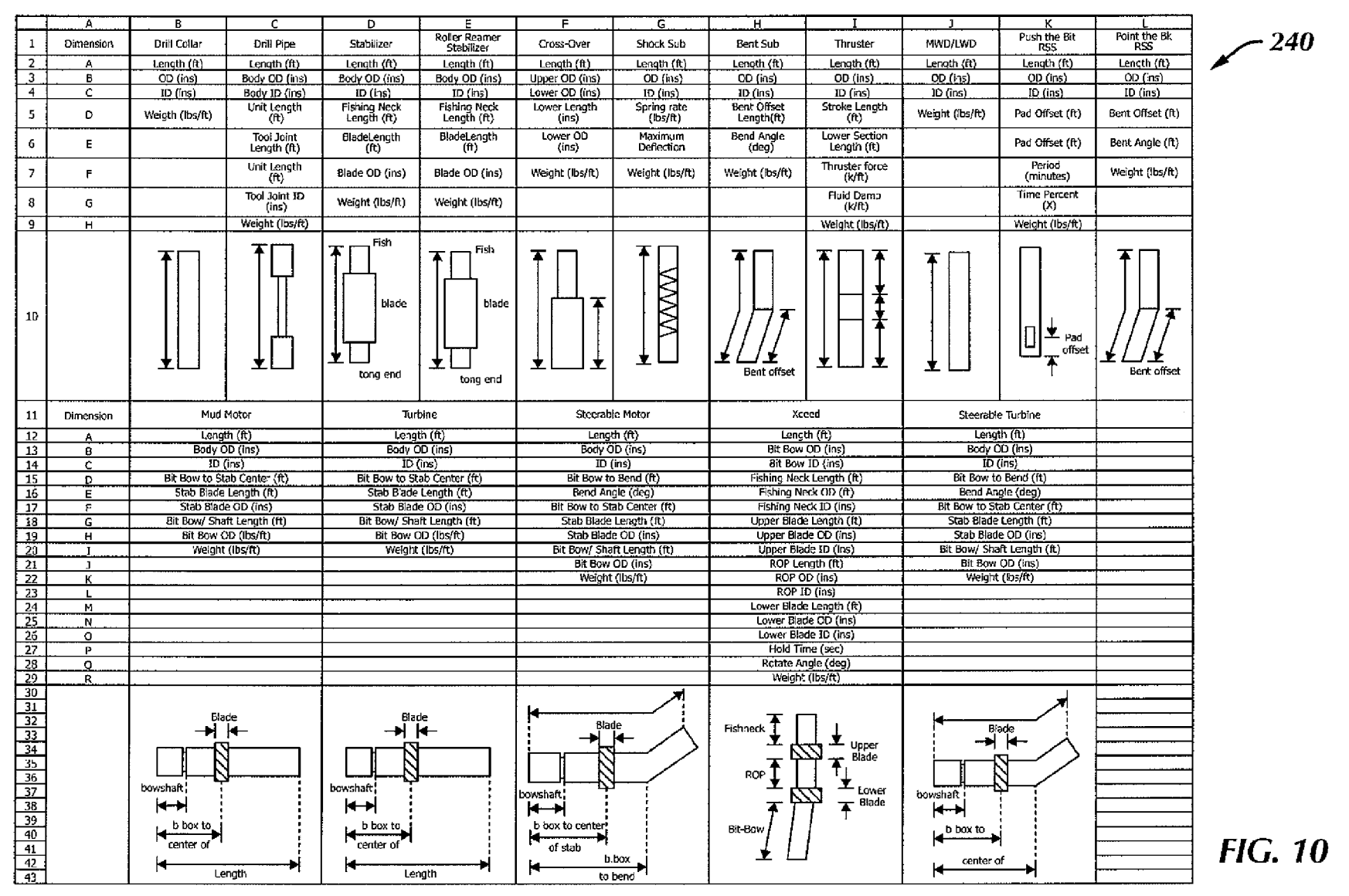

By referencing the component dimensioning sheet 240, which is the fourth spreadsheet shown in FIG. 10, the types of components and the relevant dimensions for each component is determined, and entered into the drill string information sheet 240.

One of ordinary skill will understand that the analysis request ST200 is shown as the spreadsheets in FIGS. 7-10 only as an example, and that the analysis request ST200 could take other forms known in the art.

Figure 11A:
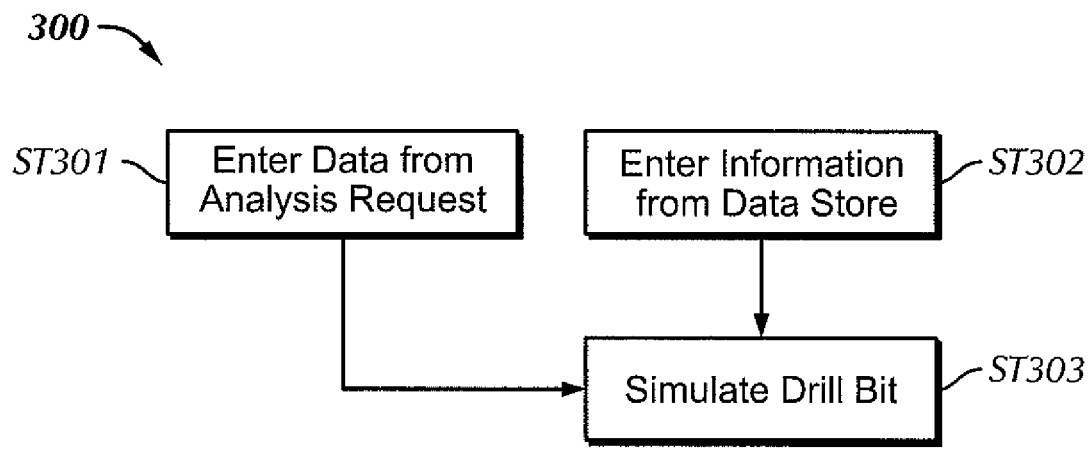
FIGS. 11(*a*)-(*c*) show examples of drill bit analysis ST300 in accordance with embodiments of the invention.
Figure 11B:
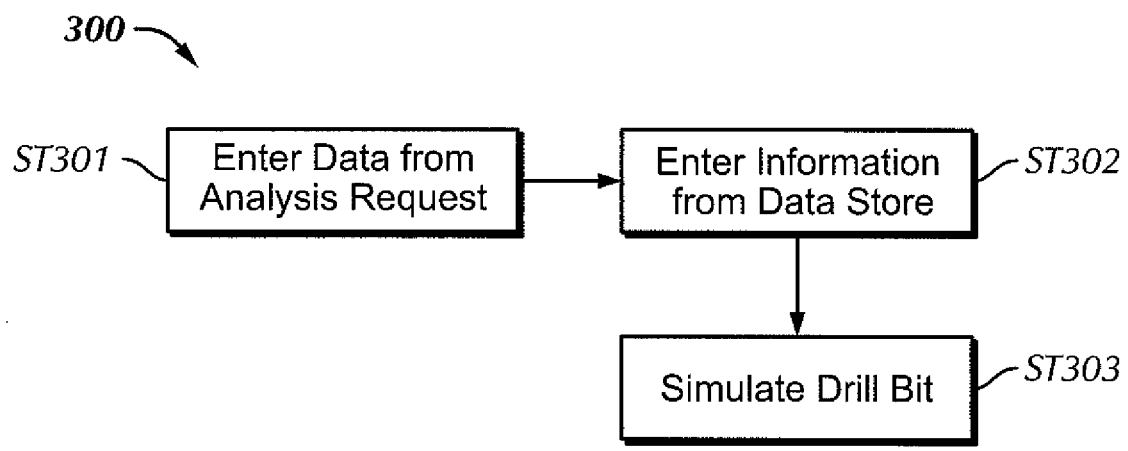
Figure 11C:
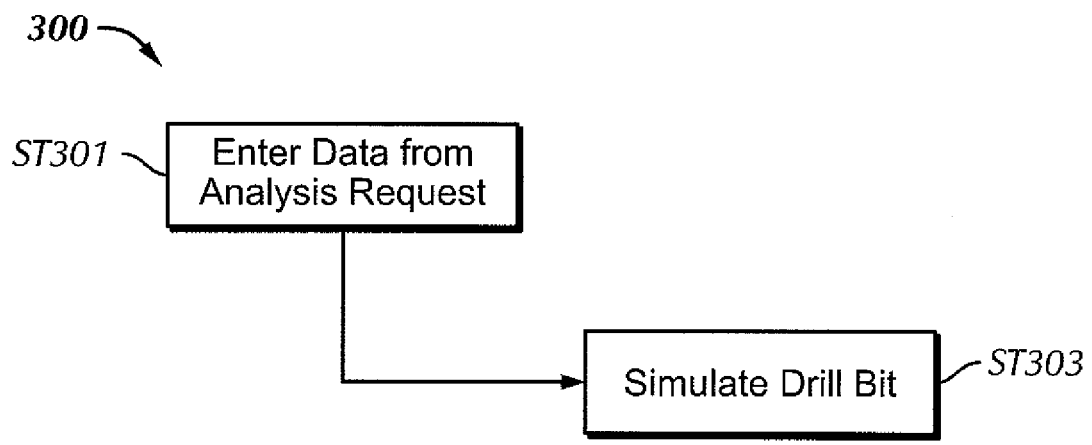

Referring now to FIGS. 11(a), 11(b), and 11(c), examples of drill bit analysis ST300 in accordance with embodiments of the invention is shown. According to one embodiment, data from the analysis request is entered ST301 concurrently with the information from the data store ST302, and drill bit is simulated ST303 as shown in FIG. 11(a). According to another embodiment, data from the analysis request is entered ST301 into the data store, and information from the data store is entered ST302, and the drill bit is simulated ST303, as shown in FIG. 11(b). According to another embodiment, analysis request data is entered ST301, and the drill bit is simulated ST303, as shown in FIG. 11(c). Additional information necessary for simulation may also come from elsewhere, such as operator knowledge, client request etc. In one embodiment, the simulation of a roller cone bit is performed in accordance with the '293 patent, as discussed in the background section. In another embodiment, the simulation of a roller cone bit is performed in accordance with SPE Paper No. 29922, as discussed in the background section. In another embodiment, if inclusion of BHA 18 is required for simulation of a roller cone bit, the simulation is performed in accordance with the '641 patent. In one embodiment, the simulation of a fixed cutter bit is performed in accordance with the '523 application, as discussed in the background section. In another embodiment, the simulation of a fixed cutter bit is performed in accordance with the '358 application, as discussed in the background section. In one embodiment, where wear characteristics are desired, the simulation of a fixed cutter bit is performed in accordance with the '354 application, as discussed in the background section. In another embodiment, if inclusion of the BHA is required for simulation of a fixed cutter, the simulation is performed in accordance with the '466 application.

Advantageously, embodiments of the present disclosure may provide a drilling engineer methods for efficiently determining a preferable drill bit for a specified drilling operation. By using previously collected data for drill bits used in drilling operations with substantially matching characterizations, a preferable drill bit for a drilling operation may be determined without requiring a time and resource intensive analysis (e.g., drilling simulation, optimization, and design processes). However, when an application with a new characterization is determined, the drilling engineer may further enhance the robustness of the data store by developing a drill bit for the new application, and then saving the outcome of the simulation for future uses. The data store may be further enhanced by later saving actual bit run data from use of the designed drill bit in the data store, such that when another application is determined to be equivalent to the characterized operation, additional bit design processes may be avoided. Thus, those of ordinary skill in the art will appreciate that as new drilling operations are characterized, and as new drill bits are subsequently designed, the data store may continuously increase in robustness, thereby further increasing the efficiency of the drill bit selection process.

Also advantageously, embodiments of the present disclosure may provide a drilling engineer the ability to test multiple drill bits with matching application characterizations, such that a preferable drill bit may be used in a drilling operation. In such a drill bit selection process, a drilling engineer may simulate two or more drill bits with matching characterizations, and then select one of the drill bits based on one or more performance values. Exemplary performance values may include a desirable rate of penetration, wear rate, vibration signature (e.g., axial vibration or lateral vibration), dull grade, etc. Selecting the preferable drill bit based on the results of the simulation may further include outputting the results of the simulation as a numerical, graphical, or other representation of the produced data. Such representations may be peer reviewed according to the processes discussed above, or may be saved in a data store for later use or viewing.

In still other embodiments, a drilling engineer may select a drill bit by charactering multiple drill bits for a plurality of applications. In such an embodiment, two or more drilling applications may be characterized. A drill bit may then be simulated for the first characterized application, and simulation results generated. A second drill bit may then be simulated for either a second application, or for both the first application and the second application, and associated simulation results generated. Those of ordinary skill in the art will appreciate that any number of additional drill bits may be simulated for either the first application, the second application, both, applications, or additional applications. After simulation results have been generated for the applications, a drill bit is selected based on the simulation results. In this embodiments, the characterizing the applications may include selecting earth formations, drilling operation parameters, and drilling conditions, as discussed above. Furthermore, each of the simulation results may include simulating the drill bits and determining performance values corresponding to the associated characterizations. In certain embodiments, the drill bit may be selected by comparing drill bits with matching characterizations to an application by comparing the results of the performance values, and determining an optimal drill bit therefrom. Those of ordinary skill in the art will appreciate that the determination of which bit is optimal for the specific application may include comparing one or more of the determined performance values or simulation results.

Advantageously, allowing the comparison of multiple drill bits characterized as matching a specified application may allow a drilling operator to choose a drill bit for an application that achieves a desired performance. The desired performance during use may be evaluated by the same performance values determined during simulation. Those of ordinary skill in the art will appreciate that any of the performance values determined during simulation or during actual use may be saved in the data store for use in subsequent drill bit selection processes. Saving actual use data and simulation data in a data store will allow drilling engineers to more efficiently select drill bits in future applications, because a larger breadth of characterized applications may have corresponding drill bits already determined. Furthermore, saving results of subsequent studies, such as peer review results, may further enhance the robustness of the data store, further increasing the efficiency of the process.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer assisted method for selecting at least one drill bit, the method comprising:
   characterizing an application; checking for at least one drill bit with an equivalent characterization in a data store; when the at least one drill bit with the equivalent characterization exists,
   selecting the at least one drill bit with the equivalent characterization; and
   when the at least one drill bit with the equivalent characterization does not exist, recommending at least one drill bit, making an analysis request, analyzing the at least one recommended drill bit based on the analysis request,
   wherein analyzing comprises simulating the at least one recommended drill bit based on information provided by the analysis request, generating analysis results, selecting at least one drill bit based on the analysis results, and modifying the data store by storing the analysis results in the data store,
   wherein the at least one recommended drill bit is determined concurrently when checking for the at least one drill bit with equivalent characterization in the data store.

2. The method of claim 1, further comprising:
   determining drilling application need, wherein the characterizing an application is based on the drilling application need.

3. The method of claim 1, further comprising:
   obtaining field performance information on the at least one selected bit, wherein the performance information is stored in the data store.

4. The method of claim 1, further comprising:
   storing the analysis results in the data store.

5. The method of claim 1, further comprising:
   conducting a peer review of the application characterization and the analysis request, wherein
   when the application characterization is determined to be unacceptable in peer review, the application is recharacterized, and
   when the analysis request is determined to be unacceptable in peer review, a revised analysis request is made.

6. The method of claim 1, wherein the at least one recommended drill bit is determined using a drilling optimization service.

7. The method of claim 6, wherein the simulating the at least one recommended drill bit is further based on information stored in the data store.

8. The method of claim 1, wherein the analysis request comprises well profile information and drill string information.

9. The method of claim 8, wherein the analysis request further comprises originator, location information, recommended drill bits, and drilling parameters.

10. The method of claim 1, wherein characterizing an application comprises characterizing bottom hole assembly, formation, drilling parameters, and well profile.

11. The method of claim 1, further comprising:
    creating a peer review presentation on the at least one selected drill bit.

12. The method of claim 1, further comprising:
    outputting at least one of the analysis results and the selected drill bit.

13. The method of claim 1, further comprising:
    drilling a well with the selected drill bit.

* * * * *

UNITED STATES PATENT AND TRADEMARK OFFICE
CERTIFICATE OF CORRECTION

| | | |
|---|---|---|
| PATENT NO. | : 8,670,963 B2 | Page 1 of 1 |
| APPLICATION NO. | : 11/777043 | |
| DATED | : March 11, 2014 | |
| INVENTOR(S) | : Sujian J. Huang | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1580 days.

Signed and Sealed this
Second Day of June, 2015

Michelle K. Lee
*Director of the United States Patent and Trademark Office*